US006431881B1

(12) United States Patent
Engbring et al.

(10) Patent No.: US 6,431,881 B1
(45) Date of Patent: Aug. 13, 2002

(54) ELECTRICAL CONNECTOR

(75) Inventors: Jürgen Engbring, Iphofen; Ulrich Grzesik, Nürnberg; Guido Renner, Kitzingen, all of (DE)

(73) Assignee: Leoni Bordnetz-Systeme GmbH & Co. KG, Nuremberg (DE)

(*) Notice: Subject to any disclaimer, the term of this patent is extended or adjusted under 35 U.S.C. 154(b) by 0 days.

(21) Appl. No.: 09/793,838

(22) Filed: Feb. 26, 2001

(30) Foreign Application Priority Data

Feb. 25, 2000 (DE) .......................................... 100 08 932

(51) Int. Cl.[7] .......................... H01R 12/00; H05K 1/00
(52) U.S. Cl. .......................... 439/77; 439/459; 439/496
(58) Field of Search ............................ 439/67, 77, 456, 439/459, 468, 498–495, 499, 687, 696, 731, 467, 519, 587, 496, 954

(56) References Cited

U.S. PATENT DOCUMENTS 3,284,756 A 11/1966 Vanstrom
3,601,761 A * 8/1971 Harris ........................ 439/587
4,526,432 A 7/1985 Cronin et al.
5,007,842 A * 4/1991 Deak et al. .................. 439/77
5,356,308 A 10/1994 Toba et al.
5,658,165 A 8/1997 Yokota
5,921,786 A * 7/1999 Slocum ........................ 439/67
5,961,350 A 10/1999 Shiu
6,139,335 A * 10/2000 Kodama ...................... 439/77
6,217,345 B1 * 4/2001 Murakami et al. ............ 439/77

FOREIGN PATENT DOCUMENTS

DE 198 05 871 A1 9/1999
EP 0 863 576 A1 9/1998

* cited by examiner

*Primary Examiner*—Gary F. Paumen
*Assistant Examiner*—Felix O. Figueroa
(74) *Attorney, Agent, or Firm*—Laurence A. Greenberg; Werner H. Stemer; Gregory L. Mayback

(57) ABSTRACT

An electrical connector includes a connector housing formed of a connector body carrying contact pins and a fixing part. A receiving gap for a foil conductor is formed between the connector body and the fixing part. At least some of the contact pins carry at least one contact element protruding into the receiving gap to make contact with a conductor track of the foil conductor. The fixing part is in the form of a sleeve and receives at least one longitudinal portion of the connector body, in an assembled state. The receiving gap, which is formed by an inner surface of the fixing part and a peripheral surface of the connector body, at least partially encloses the connector body.

18 Claims, 5 Drawing Sheets

ELECTRICAL CONNECTOR

BACKGROUND OF THE INVENTION

Field of the Invention

The invention relates to an electrical connector which can be connected to a foil conductor. When mention is made herein of foil conductors, they are to be understood as meaning flexible printed-circuit boards (FPCB), flexible flat cables (FFC), or the like. Such a connector has a connector housing, which is formed by a connector body carrying contact pins and by a fixing part. A receiving gap for a foil conductor or for an end of a foil conductor is formed between the connector body and the fixing part. The contact pins carry a contact element which protrudes into the receiving gap, where it can be brought into contact with the conductor track of a foil conductor. In the case of a connector which is known from U.S. Pat. No. 5,356,308, the connector body is constructed somewhat like a box and the fixing part is constructed as a plate. The fixing part interacts with a flat side of the connector body, leaving a receiving gap free for a printed-circuit board. Contact pins which are disposed in parallel receiving channels in the connector body protrude with resilient tongues into the receiving gap. In order to increase the number of contact points, a second plate-shaped fixing part is provided, forming a second receiving gap with the side of the connector body lying opposite the first receiving gap.

SUMMARY OF THE INVENTION

It is accordingly an object of the invention to provide an electrical connector, which overcomes the hereinafore-mentioned disadvantages of the heretofore-known devices of this general type and which, while having a simple and compact geometry, has as large a number of contact pins as possible.

With the foregoing and other objects in view there is provided, in accordance with the invention, an electrical connector, comprising a connector housing having a connector body with a peripheral surface and a sleeve-shaped fixing part with an inner surface. The fixing part receives at least one longitudinal portion of the connector body in an assembled state. The inner surface of the fixing part and the peripheral surface of the connector body defining a receiving gap therebetween at least partially enclosing the connector body. Contact pins are carried by the connector body and at least some of the contact pins protrude into the receiving gap. A foil conductor has an end disposed in the receiving gap.

Consequently, a greater utilization of an installation space made available by the connector body for contact pins is ensured in comparison with known connectors, with essentially only two main component parts being required, namely a central connector body and a sleeve-shaped fixing part fully enclosing the connector body. The foil conductor is clamped in the receiving gap and pull relief is consequently achieved. The pull relief can be further enhanced by corrugated or roughened surfaces of the connector body and the fixing part. The contact pins have a contact element, in particular, for making contact with a conductor track of the foil conductor. If contact is to be made with a plurality of conductor tracks, preferably a plurality of contact elements are assigned to a contact pin. Moreover, there is the possibility of using the contact pins to establish contact between two foil conductors inserted into the receiving gap. In this case, their mutually assigned conductor tracks are pressed against each other. The connector therefore serves in this case as a connector for two foil conductors.

Other features which are considered as characteristic for the invention are set forth in the appended claims.

Although the invention is illustrated and described herein as embodied in an electrical connector, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTIONS OF THE PREFERRED EMBODIMENTS

Figure 1:
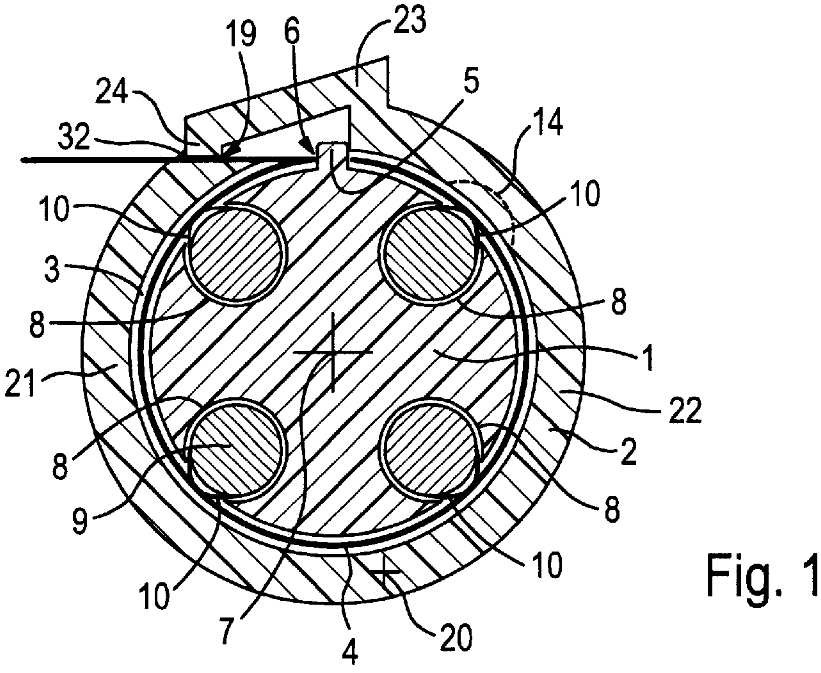
FIG. 1 is a diagrammatic, cross-sectional view of a first exemplary embodiment of a connector according to the invention.

Referring now to the figures of the drawings in detail and first, particularly, to FIG. 1 thereof, there is seen, in particular, a housing of a connector according to the invention which is composed of a central connector body 1 and a sleeve-shaped fixing part 2. The fixing part 2 has a circular inside cross section. The same correspondingly applies to an outline of the connector body 1. The fixing part 2 embraces at least one longitudinal portion of the connector body 1. The inside diameter of the fixing part 2 and the outside diameter of the connector body 1 are dimensioned in such a way that a receiving gap 3 is disposed between the two parts. In an assembled state, at least one foil conductor 4 has at least an end portion which lies in the receiving gap 3. Protruding from a peripheral surface of the connector body 1 is at least one positioning pin 5, which reaches through an opening 6 in the foil conductor 4. In this way, a position of the foil conductor within the receiving gap 3 can be defined. Another possibility for positional fixing is for the peripheral surface of the connector body to have a non-illustrated gap extending in the direction of a central longitudinal axis 7 of the connector body. An end edge of the foil conductor can be inserted in the gap in the peripheral surface. The at least one positioning pin or projection may also serve for locking the connector body 1 and the fixing part 2.

Figure 2:
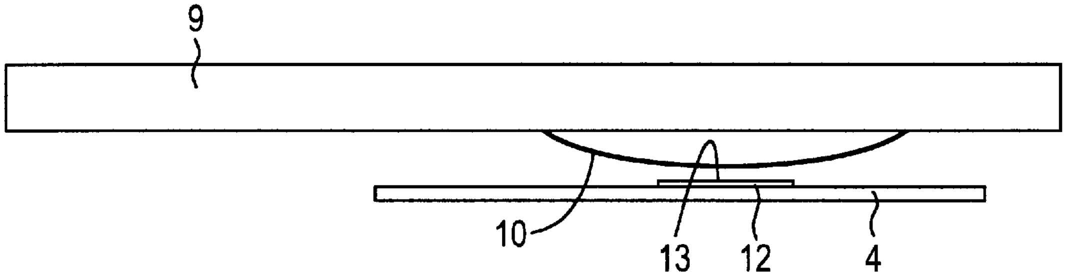
FIG. 2 is a side-elevational view of a contact pin which is put in contact with a conductor track of a foil conductor by a contact element.
Figure 3:
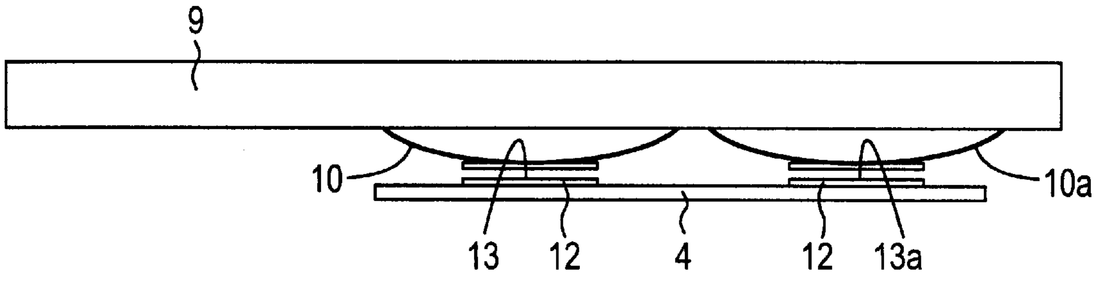
FIG. 3 is a side-elevational view of a contact pin which is put in contact with different conductor tracks of a foil conductor by two contact elements.
Figure 4:
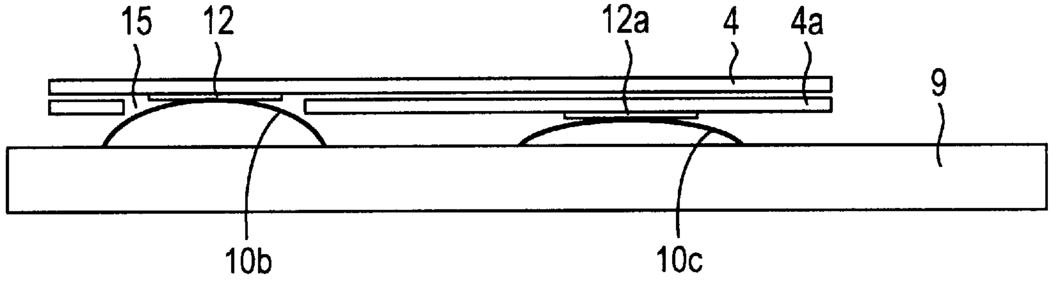
FIG. 4 is a side-elevational view of a contact pin which establishes a contact simultaneously with two foil conductors.
Figure 9:
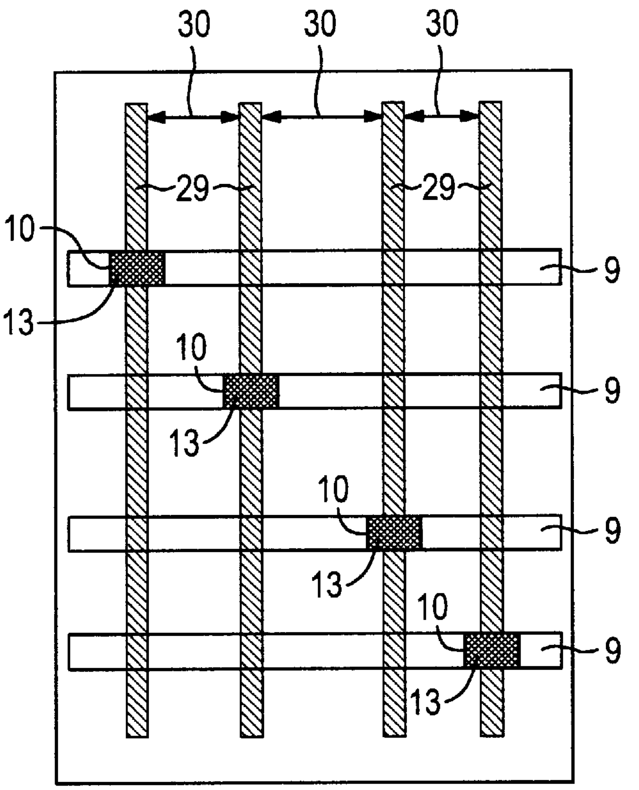
FIGS. 9 to 11 are plan views of foil conductors with different conductor track layouts.
Figure 10:
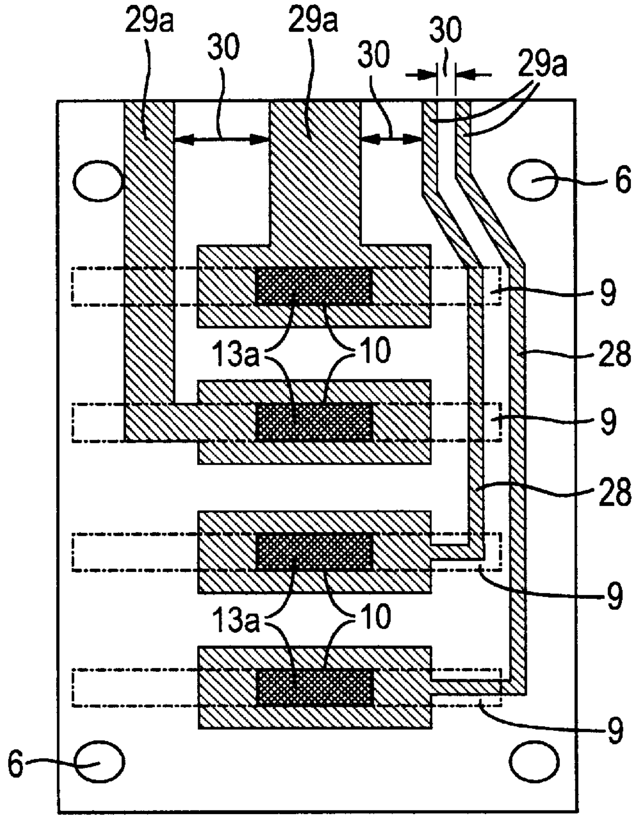

Four receiving channels 8, which are disposed in the connector body 1, extend parallel to the central longitudinal axis 7 and open into the receiving gap. A respective contact pin 9 lies in each receiving channel 8. The contact pins 9 carry at least one contact element 10, which is constructed in the form of a resilient tongue, extends radially away from the contact pin 9 and protrudes into the receiving gap 3. The contact element 10 is in electrical contact with a conductor track 12 of the foil conductor 4 disposed in the receiving gap 3. In order to make such a contact possible, an insulating layer of the foil conductor 4 facing the connector body 1 is removed, thereby forming a contact point 13, which is best seen in FIGS. 9 and 10. FIG. 2 shows one contact element 10 disposed on a contact pin 9 and placed in connection with a contact point 13. In the case of an example represented in FIG. 3, two contact elements 10, 10*a* are disposed on a contact pin 9 and are respectively placed in connection with contact points 13, 13*a*. The contact points 13, 13*a* may be assigned either to a single conductor track or to two different conductor tracks 12. The resilient structure of the contact elements 10 has the effect of ensuring adequate pressing pressure and consequently making electrical contact with the conductor tracks of the foil conductor. In this case, the foil conductor 4 is pressed against an inner wall surface of the fixing part 2. Accordingly, not only fixing due to positioning projections but also additional mechanical fixing of the foil conductor 4 in the receiving gap 3 is achieved. Another possible way of making resilient contact in the radial direction is for a region 14 of the wall surface of the fixing part 2 associated with the contact elements to be constructed as a spring element, for instance in the form of an elastomer insert or in the form of a resilient tongue. It is also conceivable for the entire inner wall surface of the fixing part to be lined with an elastomer. Apart from the aforementioned positional fixing of the foil conductor 4 within the receiving gap 3 by a positioning pin 5, it is also conceivable for the foil conductor, and in particular the contact elements 10, to have a three-dimensional or relief-like, mutually complementary structure. There may also be two foil conductors 4, 4*a* disposed in the receiving gap 3, presenting further possibilities for variation. For example, it is conceivable for the mutually facing surfaces of the two foil conductors to be stripped of their insulation at opposite contact points, so that a direct electrical contact can be established between the conductor tracks of the foil conductors. The contact elements 10 of a contact pin 9 do not necessarily have to take part in the contact-making concerned, but may serve the sole purpose of pressing the contact points of the two foil conductors against each other. In FIG. 4, conductor tracks 12, 12*a* of two foil conductors 4, 4*a* are connected to one another through the use of a contact pin 9. For this purpose, the contact pin 9 has two contact elements 10*d*, 10*c*. One contact element 10*d* is in contact with the conductor track 12 of the foil conductor 4 through a through-opening 15 in the foil conductor 4*a*. The other contact element 10*c* is in contact with the conductor track 12*a* of the foil conductor 4*a*.

A grid spacing of the contact pins 10 within the connector body lies between 2.54 and 5.08 mm and the diameter of the contact pins is 1 to 2 mm. The connector body is preferably constructed in such a way that, without the fixing part 2, it has a diameter of 5 to 10 mm and, with the fixing part, it has a diameter of 7 to 15 mm.

Figure 5:
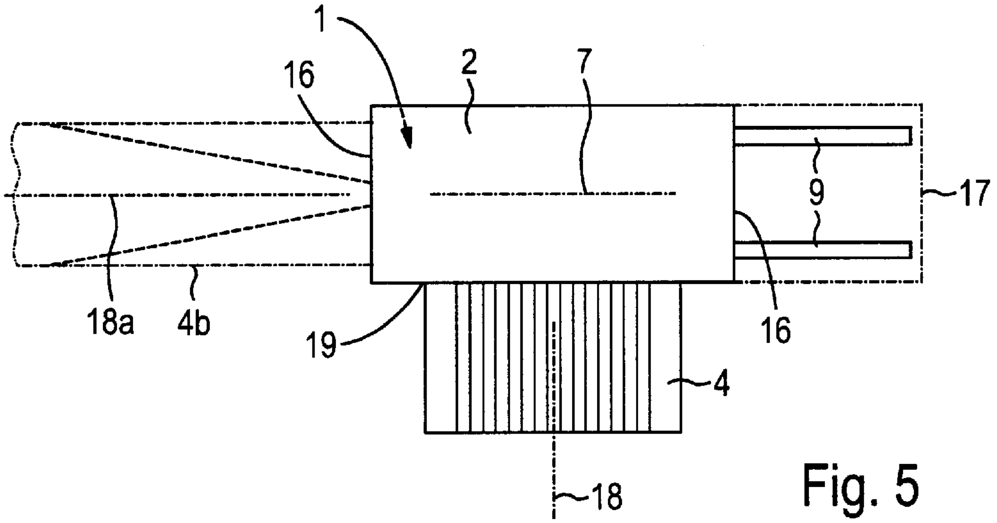
FIGS. 5 and 6 are side-elevational views of various configurations of the connector pins in a connector body.
Figure 6:
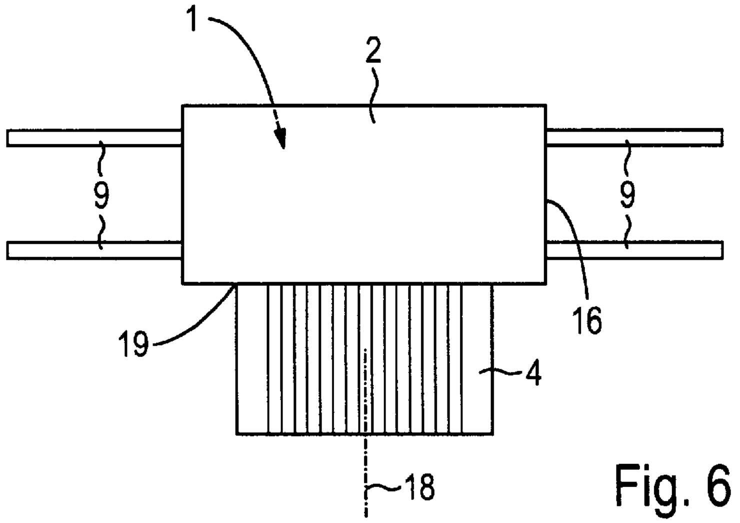

The contact pins 9 may protrude from one or both end surfaces of the connector body 1 as is seen in FIGS. 5 and 6, respectively. The contact pins 9 are constructed as an insert pin which can be inserted into a mating plug-in element or as a socket which receives a mating plug-in element. A plurality of connectors can thus be plugged together in series. As is seen in FIG. 5, the contact pins 9 protruding from one or both end surfaces 16 of the connector body 1 may be enclosed by a protective housing 17. In a further non-illustrated embodiment, the contact pins protrude from neither of the two end surfaces 16. In this case, the connector serves as a coupling element making contact between two or more foil conductors.

One foil conductor 4 is preferably placed into the receiving gap 3 in such a way that its longitudinal axis 18 extends transversely relative to the central longitudinal axis 7 of the connector body 1. In order to be able to lead the foil conductor 4 out of the fixing part 2 in a tangential direction, the fixing part has an opening 19 extending in the direction of the central longitudinal axis 7. However, a configuration in which a longitudinal axis 18*a* of the foil conductor 4*b* extends in the direction of the central longitudinal axis 7 is also possible, as is seen at the left-hand side of FIG. 5.

As is illustrated in FIG. 1, the fixing part 2 may include two half-shells 21, 22, which are mounted in such a way that they can be swiveled about a swivel axis 20 extending parallel to the central longitudinal axis 7. In such a configuration, the foil conductor 4 can initially be placed with its end around the connector body 1 and subsequently the two half-shells 21, 22 of the fixing part can be swung around the connector body 1. In order to fix the two half-shells 21, 22 in this position, a snap connection part 23 may be provided, which is fixed on one half-shell 22 and can be locked to the other half-shell 21. In this case, a free end 24 of the snap connection part 23 may be constructed in such a way that it presses the foil conductor 4 against a mating surface of the half-shell 21 and thus provides pull relief for the foil conductor 4. In this case, the aforementioned opening 19 in the fixing part 2 is formed by the separating gap between the free end 24 and the above-mentioned surface of the half-shell 21. Another assembly possibility is for the foil conductor 4 to be initially placed into the sleeve-shaped fixing part 2 and then for the connector body 1 to be pushed in from the side. Irrespective of the respective method of assembly, it is possible for the connector body to be prefitted with contact pins. Apart from the aforementioned contact-making for the conductor tracks through the use of resilient tongues, a welded, soldered or crimped connection is also conceivable. In order to protect the contact points 13 formed by the foil conductors 4 and the contact elements 10, or the contact region containing these contact points, from the ingress of moisture, the receiving gap is sealed off from the outside by sealing lips or the like.

The connector body 1 and the fixing part 2 are normally produced from plastic. However, the fixing part 2 may also be formed of metal if greater stability and an improved cooling effect are desired. The cooling effect can be further enhanced by cooling ribs on the outer peripheral surface. A fixing part being formed of metal has a further advantage which is that it serves as shielding. For this purpose, it may act together with a shielding layer that is vapor-deposited onto the foil conductor or applied in some other way.

Figure 7A:
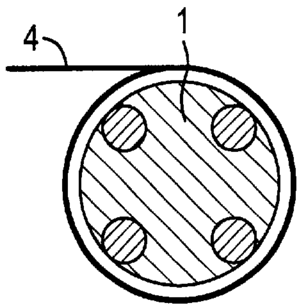
FIGS. 7A, 7B and 7C are cross-sectional views showing various shapes of connectors.
Figure 7B:
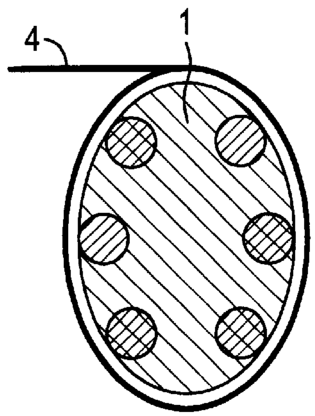
Figure 7C:
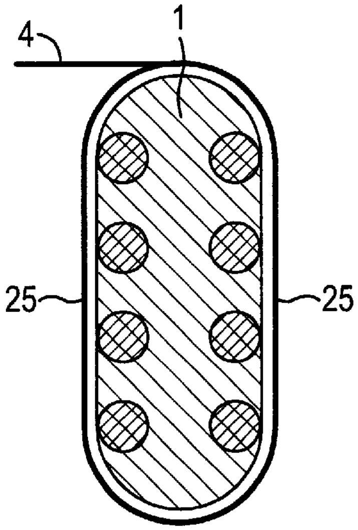

As is seen in FIGS. 7A, 7B and 7C, in principle, the cross-sectional shape of the connector body and the internal cross-sectional shape of the fixing part can have any desired form. However, a round or oval shape is advantageous and it is also possible for the oval shape to have flattened regions 25 running parallel to each other.

Figure 8:
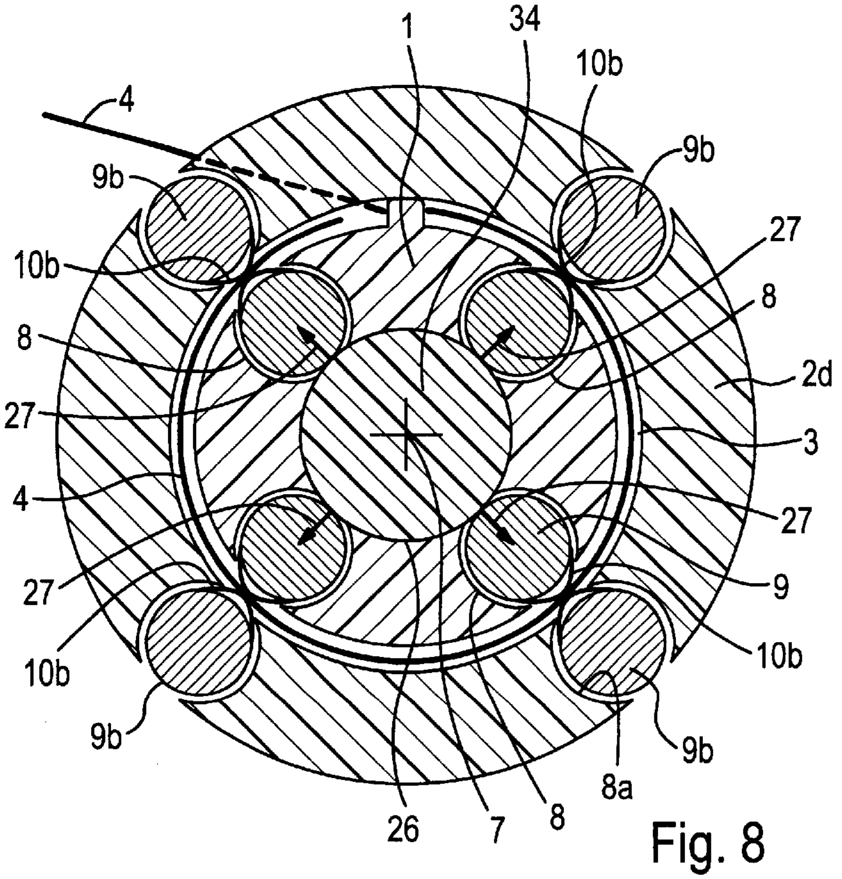
FIG. 8 is a view similar to FIG. 1 of a further exemplary embodiment of a connector according to the invention, in which contact pins are present both in a connector body and in a fixing part.

In the embodiment represented in FIG. 8, a fixing part 2*a* also carries contact pins 9*b*, which are respectively disposed in receiving channels 8*a* extending parallel to the central longitudinal axis 7 of the connector body 1. The contact pins

9*b* are constructed like the contact pins 9 disposed in the connector body 1. In other words, they have at least one contact element 10*b* which protrudes into the receiving gap 3 and serves for making contact with the conductor track of a foil conductor 4. The receiving channels 8*a* and the contacts 9*b* are expediently disposed in such a way that they lie opposite the contact pins 9 in the connector body 1. However, other configurations are also conceivable. In the exemplary embodiment according to FIG. 8, the installation space provided by the connector housing is utilized even more. Contact can be made from two sides with a foil portion lying in the receiving gap. It is also conceivable for two foil conductors which are in direct electrical contact at their mutually facing sides and with which contact is additionally made through the contact pins 9, 9*b*, to lie in the receiving gap 3.

In order to generally enhance the fixing of the foil conductor 4 within the receiving gap 3 and the pull relief for the foil conductor 4, it is expedient if the contact pins 9 disposed in the connector body 1 can be subjected to a radially outwardly directed force from the center of the connector body 1. This can be accomplished in the following way: a central bore 26 within the connector body 1 intersects the receiving channels 8. A non-illustrated filler which can be inserted into the bore 26 has an outer peripheral surface forcing the contact pins 9 radially outward in the direction of arrows 27. As a result, the contact elements 10 of the contact pins 9 press the foil conductor 4 either against the inner wall surface of the fixing part 2 or against the contact elements 10*b* of the contact pins 9*b* disposed in the fixing part 2.

Figure 11:
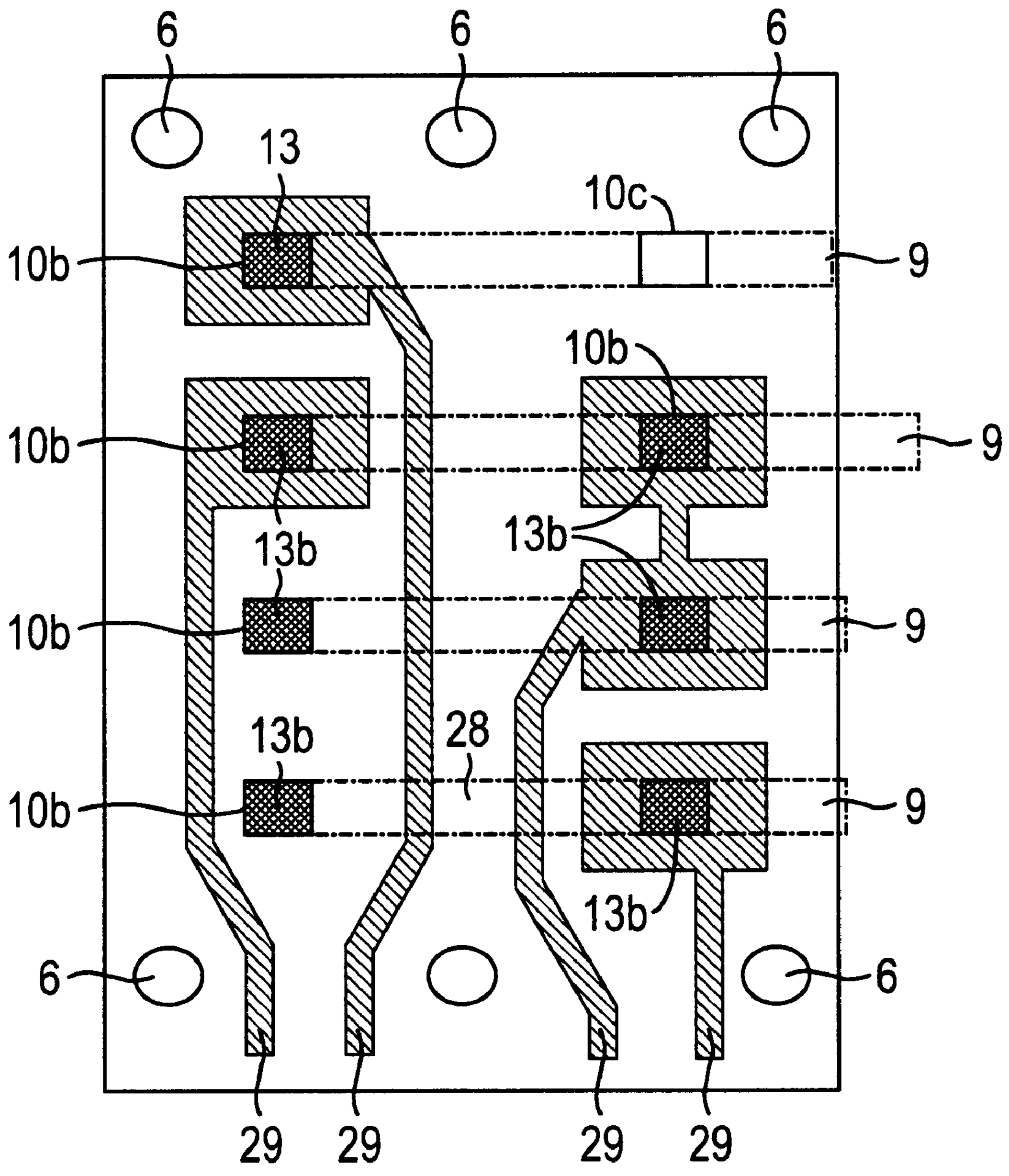

FIGS. 9 to 11 show examples of the virtually unlimited possibilities for variation offered by a connector according to the invention with regard to the layout for the end portion of a foil conductor or for a flexible printed-circuit board and the configuration of the contact elements 10 with a given grid spacing of the contact pins 9.

The example according to FIG. 9 shows the end portion of a foil conductor with parallel conductor tracks 29 that can be connected to a connector. The parallel alignment of the conductor tracks continues into the contact region of the connector. It can be seen that a mutual spacing 30 of the conductor tracks does not influence the grid spacing of the contact pins. Adaptation to other spacing dimensions of the conductor tracks takes place through correspondingly altered longitudinal positions of the contact elements 10 on the contact pins 9.

However, it may also be expedient to adapt the layout of a foil conductor or of a printed-circuit board to a given longitudinal position of the contact elements, as is the case in the examples according to FIGS. 10 and 11. For example, conductor tracks 29*a* having a different width or with a different lateral spacing can be connected through conductor track portions 28 to the contact points 13 assigned to the contact elements 10.

In order to improve the contact between the conductor track 29 or the conductor track portion 28 and the contact element 10, it is advantageous to enlarge the surface area of the contact points 13*a* which are exposed on the foil conductor, as is shown in FIG. 10, or to provide a plurality of contact points 13*b* assigned to a contact pin, as is shown in FIG. 11. if there is a plurality of contact elements 10*b* on a contact pin 9 line crossovers can be realized in a simple way, as is shown in FIG. 11. In the case of a plurality of contact elements 10, it is not absolutely necessary for every contact element to be assigned a contact point. There is accordingly no contact point in the region of a contact element 10*c* which is not required for contact-making. In other words, the conductor track of the foil conductor is not exposed.

We claim:

1. An electrical connector, comprising:

a connector housing having a connector body extending along a central longitudinal axis with a curved peripheral surface and a sleeve-shaped fixing part with an inner surface, said fixing part receiving at least one longitudinal portion of said connector body in an assembled state, and said inner surface of said fixing part and said curved peripheral surface of said connector body defining a receiving gap therebetween at least partially enclosing said connector body;

contact pins extending in a direction of said central longitudinal axis and carried by said connector body, at least some of said contact pins protruding into said receiving gap; and a foil conductor having an end disposed in said receiving gap and having a longitudinal axis extending transversely to said central longitudinal axis of said connector body.

2. The connector according to claim 1, wherein said connector body has two end surfaces, a central longitudinal axis and receiving channels extended in direction of said central longitudinal axis and opening out into at least one of said two end surfaces, said contact pins each disposed in a respective one of said receiving channels.

3. The connector according to claim 2, wherein said contact pins are radially movably disposed in said receiving channels for receiving a radially outwardly directed force centrally from said connector body.

4. The connector according to claim 3, wherein said connector body has a central bore formed therein extending in direction of said central longitudinal axis and intersecting said receiving channels in intersecting regions, and said contact pins have a periphery partially protruding through said intersecting regions into said bore for radially outward movement by a filler inserted into said bore.

5. The connector according to claim 1, wherein said fixing part carries other contact pins respectively protruding into said receiving gap for making contact with said foil conductor.

6. The connector according to claim 5, wherein said other contact pins each have at least one contact element.

7. The connector according to claim 6, wherein said other contact pins of said fixing part have a construction corresponding to said contact pins disposed in said connector body.

8. The connector according to claim 1, wherein said connector body and said fixing part have a substantially circular cross-sectional shape.

9. The connector according to claim 1, wherein said connector body and said fixing part have a substantially oval cross-sectional shape.

10. The connector according to claim 1, wherein said connector body has a central longitudinal axis, and said contact pins are radially sprung, with respect to said central longitudinal axis, into making contact with said foil conductor.

11. The connector according to claim 10, wherein said contact pins have contact elements constructed as resilient tongues protruding radially out of said contact pins.

12. The connector according to claim 1, wherein said connector body has a central longitudinal axis, and said fixing part includes two half-shells divided in longitudinal direction and mounted to swivel against each other about a swivel axis running in direction of said central longitudinal axis.

13. The connector according to claim 12, wherein a snap connection arrests said half-shells when enclosing said connector body.

14. The connector according to claim 1, wherein said receiving gap has a contact region containing said foil conductor and said contact pins, and a sealing element seals off said contact region from the outside.

15. The connector according to claim 14, wherein said sealing element is a sealing lip.

16. The connector according to claim 1, wherein said connector body has a central longitudinal axis, said fixing part has a slit-shaped opening extending in direction of said central longitudinal axis, and said foil conductor passes through said slit-shaped opening, in said assembled state.

17. The connector according to claim 1, wherein said peripheral surface of said connector body has at least one positioning projection cooperating with an opening in said foil conductor.

18. An electrical connector, comprising;

a connector housing having a connector body extending along a central longitudinal axis with a curved peripheral surface and a sleeve-shaped fixing part with an inner surface, said fixing part receiving at least one longitudinal portion of said connector body in an assembled state, and said inner surface of said fixing part and said curved peripheral surface of said connector body defining a receiving gap therebetween at least partially enclosing said connector body;

contact pins extending in a direction of said central longitudinal axis and carried by said connector body, at least some of said contact pins protruding into said receiving gap; and said receiving gap being constructed to receive an end of a foil conductor to be disposed in said receiving gap, said foil conductor having a longitudinal axis extending transversely to said central longitudinal axis of said connector body.

* * * * *